(12) United States Patent
Nakajima et al.

(10) Patent No.: US 11,196,232 B2
(45) Date of Patent: Dec. 7, 2021

(54) MODULATION DOPED SEMICONDUCTOR LASER AND MANUFACTURING METHOD THEREFOR

(71) Applicant: Lumentum Japan, Inc., Kanagawa (JP)

(72) Inventors: Takayuki Nakajima, Tokyo (JP); Atsushi Nakamura, Nagano (JP); Yuji Sekino, Kanagawa (JP)

(73) Assignee: Lumentum Japan, Inc., Kanagawa (JP)

(*) Notice: Subject to any disclaimer, the term of this patent is extended or adjusted under 35 U.S.C. 154(b) by 56 days.

(21) Appl. No.: 16/845,235

(22) Filed: Apr. 10, 2020

(65) Prior Publication Data

US 2021/0057886 A1 Feb. 25, 2021

(30) Foreign Application Priority Data

Aug. 19, 2019 (JP) .............................. JP2019-150057
Oct. 16, 2019 (JP) .............................. JP2019-189348

(51) Int. Cl.
*H01S 5/00* (2006.01)
*H01S 5/30* (2006.01)
(Continued)

(52) U.S. Cl.
CPC ............ *H01S 5/309* (2013.01); *H01S 5/3077* (2013.01); *H01S 5/3086* (2013.01); *H01S 5/34* (2013.01);
(Continued)

(58) Field of Classification Search
CPC ........ H01S 5/3077; H01S 5/34; H01S 5/3086; H01S 5/309; H01S 5/34366; H01S 5/12; H01S 5/3063; H01S 5/305; H01S 2304/04

See application file for complete search history.

(56) References Cited

U.S. PATENT DOCUMENTS 4,881,235 A * 11/1989 Chinone ............... B82Y 20/00
                                              372/45.01
4,961,197 A * 10/1990 Tanaka .................. B82Y 20/00
                                              257/21
(Continued)

FOREIGN PATENT DOCUMENTS

JP      H10-284799 A    10/1998
JP      2012-220530 A   11/2012

*Primary Examiner* — Kinam Park
(74) *Attorney, Agent, or Firm* — Harrity & Harrity, LLP (57) ABSTRACT

A modulation doped semiconductor laser includes a multiple quantum well composed of a plurality of layers including a plurality of first layers and a plurality of second layers stacked alternately and including an acceptor and a donor; a p-type semiconductor layer in contact with an uppermost layer of the plurality of layers; and an n-type semiconductor layer in contact with a lowermost layer of the plurality of layers, the plurality of first layers including the acceptor so that a p-type carrier concentration is 10% or more and 150% or less of the p-type semiconductor layer, the plurality of second layers containing the acceptor so that the p-type carrier concentration is 10% or more and 150% or less of the p-type semiconductor layer, the plurality of second layers containing the donor, and an effective carrier concentration corresponding to a difference between the p-type carrier concentration and an n-type carrier concentration is 10% or less of the p-type carrier concentration of the plurality of second layers.

20 Claims, 8 Drawing Sheets

(51) Int. Cl.
*H01S 5/34* (2006.01)
*H01S 5/343* (2006.01)
*H01S 5/12* (2021.01)

(52) U.S. Cl.
CPC ............ *H01S 5/34366* (2013.01); *H01S 5/12* (2013.01); *H01S 5/305* (2013.01); *H01S 5/3063* (2013.01); *H01S 2304/04* (2013.01)

(56) References Cited

U.S. PATENT DOCUMENTS

| | | | | |
|---|---|---|---|---|
| 5,789,773 | A * | 8/1998 | Takeoka | B82Y 20/00 257/101 |
| 6,455,877 | B1 * | 9/2002 | Ogawa | H01L 33/025 257/99 |
| 7,408,199 | B2 * | 8/2008 | Matsuyama | H01S 5/2231 257/79 |
| 2006/0273336 | A1 * | 12/2006 | Fujikura | H01L 33/42 257/98 |
| 2008/0175293 | A1 * | 7/2008 | Tanaka | B82Y 20/00 372/45.01 |

* cited by examiner

MODULATION DOPED SEMICONDUCTOR LASER AND MANUFACTURING METHOD THEREFOR

CROSS-REFERENCE TO RELATED APPLICATIONS

The present application claims priority from Japanese patent applications JP 2019-150057, filed on Aug. 19, 2019, and JP 2019-189348, filed on Oct. 16, 2019, the contents of which are hereby incorporated by reference into this application.

TECHNICAL FIELD

The present disclosure relates to a modulation doped semiconductor laser and a manufacturing method therefor.

BACKGROUND

A modulation doped semiconductor laser may include an acceptor that is added to a barrier layer of a multiple quantum well (MQW). In a metal organic chemical vapor deposition (MOCVD) method, which is often used for crystal growth of optical semiconductor elements, zinc (Zn) is mainly used as a p-type dopant. Zn tends to diffuse during crystal growth. For this reason, the carrier concentration of a p-side SCH decreases, and the carrier concentration of MQW increases. Beryllium having low diffusibility may be used instead of Zn, but beryllium cannot be used for MOCVD. It is also known that p-type dopant diffuses into MQW and the carrier concentration in MQW increases.

SUMMARY

According to some possible implementations, a modulation doped semiconductor laser includes a multiple quantum well composed of a plurality of layers including a plurality of first layers and a plurality of second layers stacked alternately and including an acceptor and a donor; a p-type semiconductor layer in contact with an uppermost layer of the plurality of layers; and an n-type semiconductor layer in contact with a lowermost layer of the plurality of layers, the plurality of first layers including the acceptor so that a p-type carrier concentration is 10% or more and 150% or less of the p-type semiconductor layer, the plurality of second layers containing the acceptor so that the p-type carrier concentration is 10% or more and 150% or less of the p-type semiconductor layer, the plurality of second layers containing the donor, and an effective carrier concentration corresponding to a difference between the p-type carrier concentration and an n-type carrier concentration is 10% or less of the p-type carrier concentration of the plurality of second layers.

According to some possible implementations, a manufacturing method of a modulation doped semiconductor laser includes forming an n-type semiconductor layer; forming a multiple quantum well composed of a plurality of layers including a plurality of first layers and a plurality of second layers stacked alternately and containing an acceptor and a donor so that a lowermost layer of the plurality of layers is placed in contact with the n-type semiconductor; and forming a p-type semiconductor layer by a metal organic chemical vapor deposition method so as to be placed in contact with an uppermost layer of the plurality of layers, the plurality of first layers including the acceptor so that a p-type carrier concentration is 10% or more and 150% or less of the p-type semiconductor layer, the plurality of second layers containing the acceptor so that the p-type carrier concentration is 10% or more and 150% or less of the p-type semiconductor layer, the plurality of second layers containing the donor, and an effective carrier concentration corresponding to a difference between the p-type carrier concentration and an n-type carrier concentration is 10% or less of the p-type carrier concentration of the plurality of second layers.

DETAILED DESCRIPTION

The following detailed description of example implementations refers to the accompanying drawings. The same reference numbers in different drawings may identify the same or similar elements.

Figure 1:
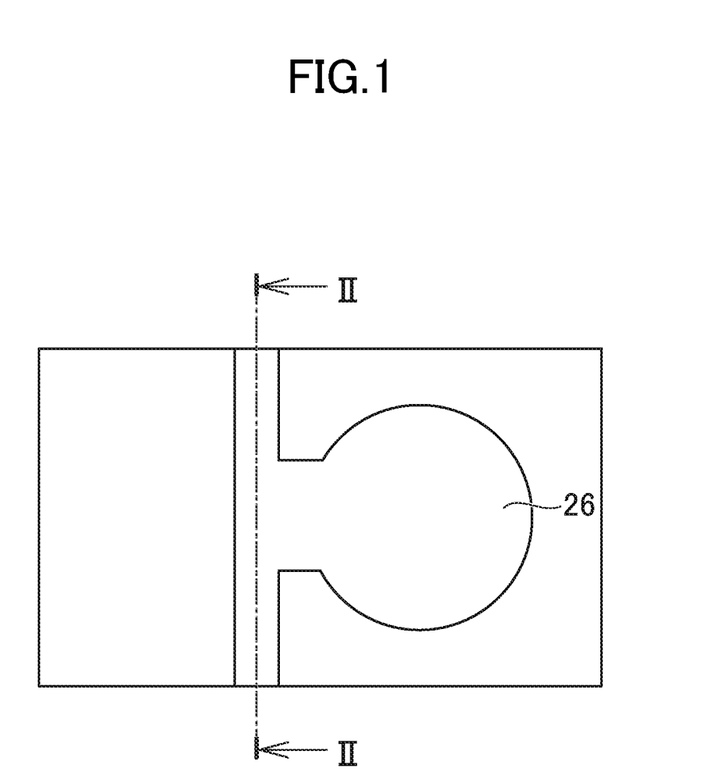
FIG. 1 is a plan view of a modulation doped semiconductor laser according to a first example.
Figure 2:
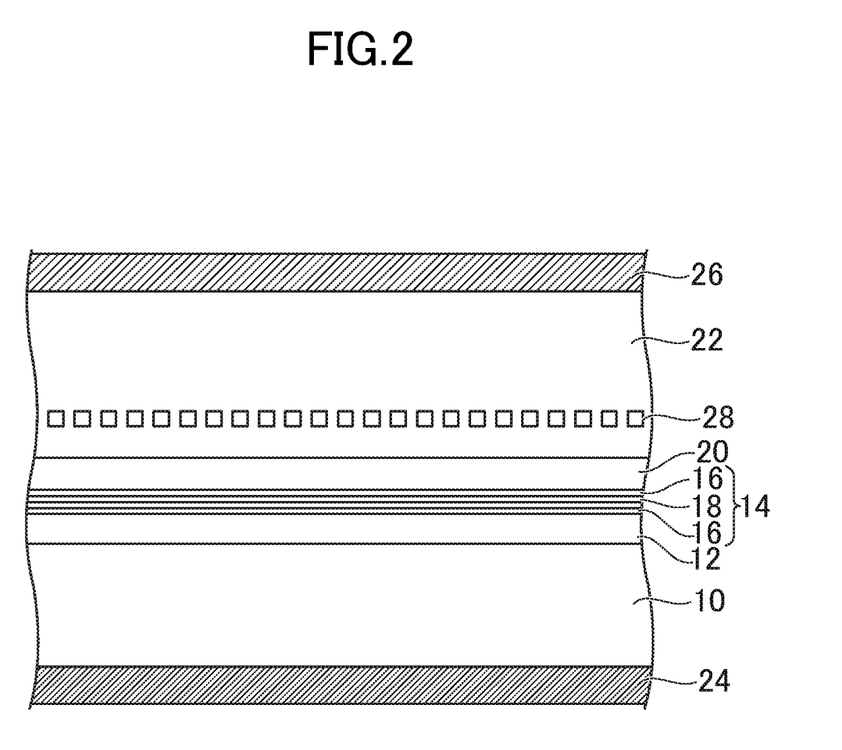
FIG. 2 is a cross-sectional view taken along the line II-II of the modulation doped semiconductor laser shown in FIG. 2.

FIG. 1 is a plan view of a modulation doped semiconductor laser according to an implementation. FIG. 2 is a cross-sectional view taken along the line II-II of the modulation doped semiconductor laser shown in FIG. 1.

The modulation doped semiconductor laser may be a distributed feedback (DFB) laser. The modulation doped semiconductor laser may be a modulator-integrated semiconductor optical device (for example, a modulator-integrated laser) in which a modulation unit (not shown) is monolithically integrated. The modulator-integrated laser modulates continuous light emitted by injecting a drive current into a laser unit with the modulation unit and outputs signal light. The modulation unit may be an electro-absorption modulator (EA) modulator. The electro-absorption modulator is widely used due to the small size thereof and low cost, in addition to having advantageous characteristics such as a small chirp (wave modulation), a large extinction ratio that is the difference between the ON level and OFF level of an optical signal, and a wide band.

The modulation doped semiconductor laser has a ridge structure. The ridge structure is a structure in which a multiple quantum well, which will be described later, spreads laterally and a semiconductor mesa stripe (waveguide) is formed thereon. The modulation doped semiconductor laser may have a buried heterostructure (BH). The BH structure refers to a structure in which multiple quantum wells are in a mesa stripe and have buried layers on both sides of the mesa stripe structure. Since the BH structure has a strong effect of confining light in the lateral direction and the a Far Field Pattern (FFP) becomes more circular, the BH structure has the advantage of high coupling efficiency with an optical fiber and further has the advantage of excellent heat dissipation.

[n-Type Semiconductor Layer]

The modulation doped semiconductor laser has an n-type semiconductor layer 12 (InGaAlAs layer) on a lower cladding layer 10 (n-type InP layer). The donor (n-type dopant) of the n-type semiconductor layer 12 is Si. Si is known to have little diffusion during crystal growth. The n-type semiconductor layer 12 is for constituting a separate confinement heterostructure (SCH).

[Multiple Quantum Well]

The modulation doped semiconductor laser includes a multiple quantum well (MQW) 14. The multiple quantum well 14 contains an acceptor (p-type dopant) and a donor (n-type dopant). The multiple quantum well 14 is composed of a plurality of layers, and the lowermost layer is in contact with the n-type semiconductor layer 12.

The plurality of layers constituting the multiple quantum well 14 includes a plurality of first layers 16. The uppermost layer of the plurality of layers is the first layer 16. The lowest layer of the plurality of layers is also the first layer 16. Each of the plurality of first layers 16 is a barrier layer (InGaAlAs layer). The plurality of layers constituting the multiple quantum well 14 include a plurality of second layers 18. Each of the plurality of second layers 18 is a quantum well layer (InGaAlAs layer). The plurality of first layers 16 and the plurality of second layers 18 are alternately stacked.

The first layer 16 (barrier layer) contains an acceptor (p-type dopant). The acceptor is at least one of Zn and Mg. The second layer 18 (quantum well layer) also contains an acceptor (p-type dopant). The second layer 18 (quantum well layer) also contains a donor (n-type dopant). The donor is Si (the same material as the donor of the n-type semiconductor layer 12).

[p-Type Semiconductor Layer]

The modulation doped semiconductor laser includes a p-type semiconductor layer 20 (InGaAlAs layer). The acceptor of the p-type semiconductor layer 20 is, for example, at least one of Zn or Mg (the same material as the acceptor of the first layer 16), and it is extremely difficult to suppress diffusion. The p-type semiconductor layer 20 is in contact with the uppermost layer (first layer 16) of the multiple quantum well 14. The p-type semiconductor layer 20 is for constituting a separate confinement heterostructure (SCH). An upper cladding layer 22 (p-type InP layer) is stacked on the p-type semiconductor layer 20. A diffraction grating 28 is formed on the p-type semiconductor layer 20.

On the back surface of the lower cladding layer 10, there is an electrode 24 (for example, a cathode). On the upper cladding layer 22, there is an electrode 26 (for example, an anode) for applying a voltage opposite to the electrode 24 (for example, the cathode).

[Carrier Concentration]

Figure 3A:
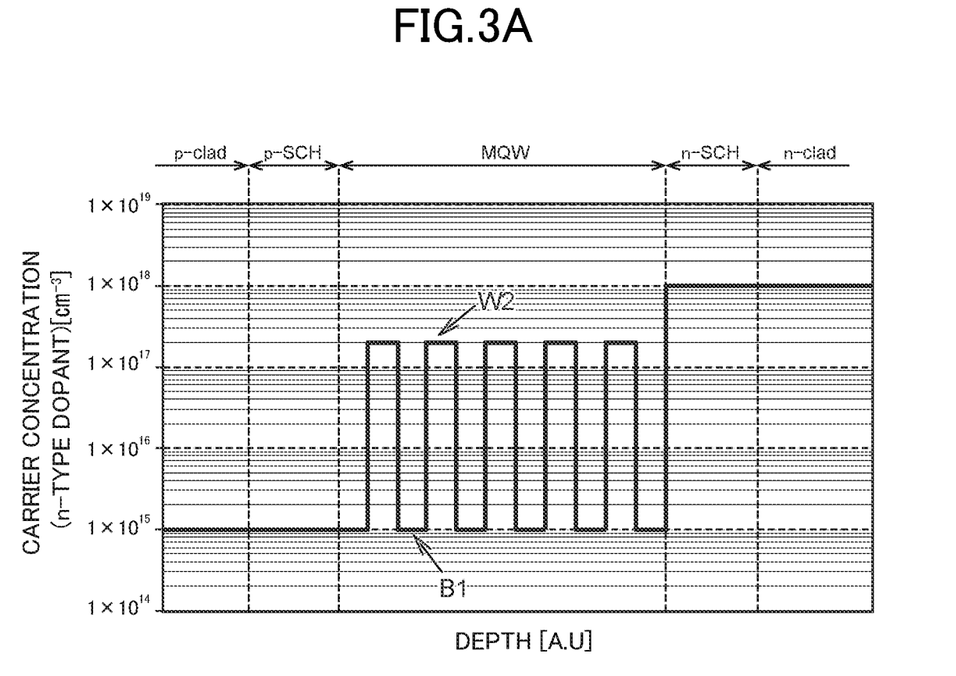
FIG. 3A is a view showing a carrier concentration of a donor (n-type dopant).
Figure 3B:
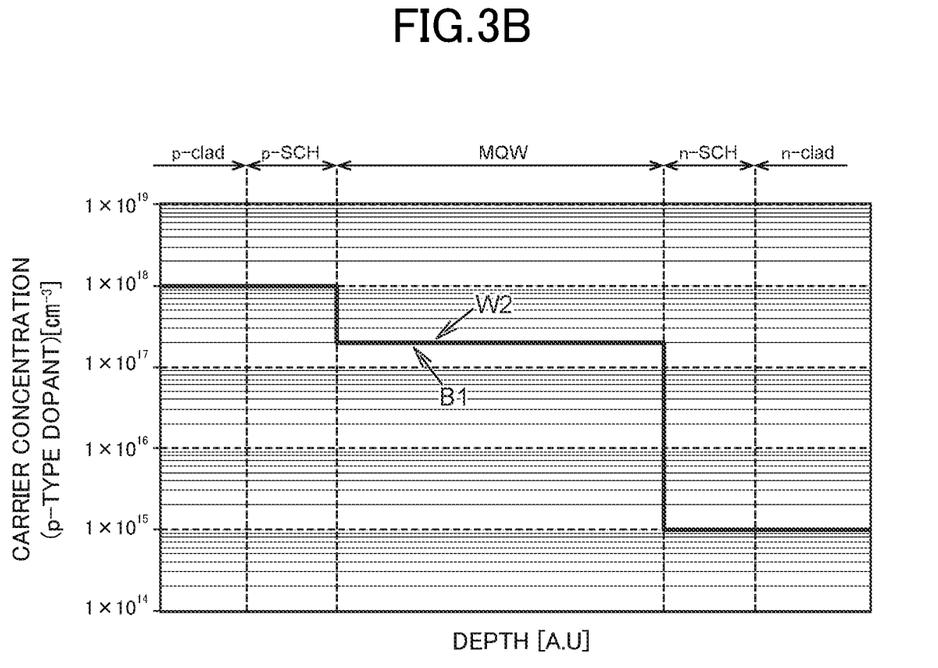
FIG. 3B is a view showing a carrier concentration of an acceptor (p-type dopant).
Figure 3C:
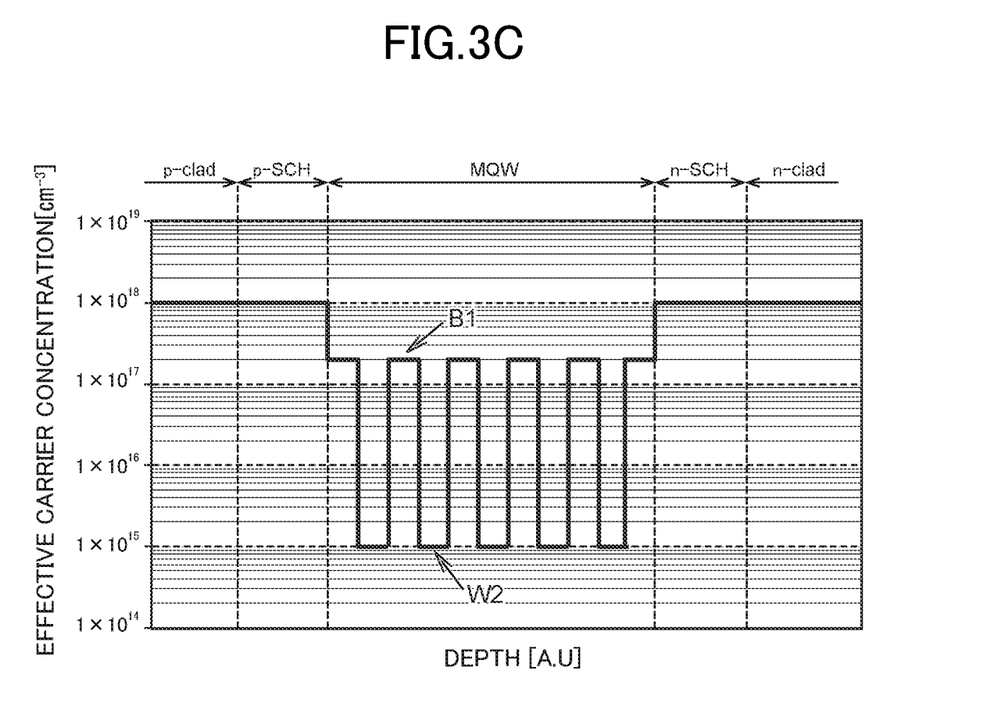
FIG. 3C is a view showing a difference (effective carrier concentration) between the p-type carrier concentration and the n-type carrier concentration.

FIGS. 3A to 3C are views showing carrier concentrations in the vicinity of the multiple quantum well (MQW) in an implementation. Here, the carrier concentration indicates the density of the added impurity. Strictly speaking, not all doped impurities function as carriers, but here, for the sake of simplicity of description, all impurities function as carriers. Moreover, even in a state where no impurities are intentionally added, the semiconductor contains a very small amount of various impurities, and the amount of the impurities not intentionally added and that does not effectively function as carriers is $1\times10^{15}$ cm$^{-3}$ or less.

In FIGS. 3A to 3C, the horizontal axis shows the expanded width of the multiple quantum well 14 (MQW) for easy description, and an actual ratio is different from other layers. Furthermore, an actual profile changes smoothly in a boundary surface of each layer due to the diffusion of dopants due to the multilayer growth, but a change in the carrier concentration is shown steeply for the sake of description.

FIG. 3A is a view showing the carrier concentration of a donor (n-type dopant). Si as a donor is not added to the upper cladding layer 22 (p-clad) and the p-type semiconductor layer 20 (p-SCH). Si ($2\times10^{17}$ cm$^{-3}$) as a donor is added to a quantum well layer (W2) that is the second layer 18 of the multiple quantum well 14 (MQW). The n-type semiconductor layer 12 (n-SCH) is doped with $1\times10^{18}$ cm$^{-3}$ of Si as an impurity. The quantum well layer (W2) is lower than the n-type semiconductor layer 12 in the n-type carrier concentration. An n-type dopant is added to the lower cladding layer 10 (n-clad) from the beginning. Although an example of Si is shown here, other donors may be used.

FIG. 3B is a view showing a carrier concentration of an acceptor (p-type dopant). Zn, which is a p-type dopant, is not added to the n-type semiconductor layer 12 (n-SCH). Zn, which is a p-type dopant, is added to the upper cladding layer 22 (p-clad). The acceptor may be Mg.

The p-type semiconductor layer 20 (p-SCH) and the upper cladding layer 22 (p-clad) are each doped with $1\times10^{18}$ cm$^{-3}$ of Zn as an impurity. In the multiple quantum well 14 (MQW), $2\times10^{17}$ cm$^{-3}$ of Zn is doped in both a barrier layer (B1) as the first layer 16 and the quantum well layer (W2).

In the multiple quantum well 14 (MQW), the p-type carrier concentration is $1\times10^{17}$ cm$^{-3}$ or more in both the barrier layer (B1) and the quantum well layer (W2). In the multiple quantum well 14 (MQW), the barrier layer (B1) and the quantum well layer (W2) both have a p-type carrier concentration of 10% to 150% of the p-type semiconductor layer 20 (p-SCH) (for example, lower than the p-type semiconductor layer 20).

FIG. 3C is a view showing a difference (effective carrier concentration) between the p-type carrier concentration and the n-type carrier concentration. As described above, the p-type carrier is doped Zn, and the n-type carrier is doped Si. In the quantum well layer (W2), since both Zn and Si are doped at approximately the same concentration, the two carriers cancel each other, and the effective carrier concentration (difference between the p-type carrier concentration and the n-type carrier concentration) becomes very low.

In the quantum well layer (W2), the effective carrier concentration is 10% or less of the p-type carrier concentration in the quantum well layer (W2). On the other hand, in the barrier layer (B1), only Zn is doped and p-type carriers remain. That is, a modulation doped semiconductor laser is configured.

In a case where the barrier layer is doped only with p-type carriers, in the modulation doped semiconductor lasers of the related art, nothing is doped in the quantum well layer, in general. As described above, Zn and Mg, which are p-type impurities, have a property of diffusing. Therefore, in a case where a p-type dopant is added only to the barrier layer, the p-type dopant may be diffused into the quantum well layer. As a result, the desired carrier density (as designed) decreases in the barrier layer and increases in the quantum well layer, and the desired characteristics cannot be obtained.

In an implementation, the quantum well layer (W2) is also added with a p-type dopant having the same density as that of the barrier layer (B1), and therefore diffusion hardly occurs. If this is the case, since the quantum well layer (W2) will also be p-type, but is simultaneously doped with the n-type dopant Si, the effective carrier concentration becomes very small, and a modulation doped semiconductor laser in which only the barrier layer (B1) is substantially p-type can be realized. Si has been found to have very little diffusion, and there is no need to consider the diffusion of Si. Since there is no influence due to diffusion, the designed characteristics can be obtained.

Further, Zn diffuses also from the p-type semiconductor layer 20 (p-SCH) and the upper cladding layer 22 (p-clad) on the multiple quantum well 14 (MQW). However, since the multiple quantum well 14 (MQW) and the upper layer thereof are relatively close in carrier concentration, the amount of diffusion can be sufficiently reduced. Therefore, it is possible to obtain desired characteristics that are not easily affected by diffusion.

The density of Zn and Si doped in the quantum well layer (W2) is preferably the same, but if the density is within ±10%, the quantum well layer functions sufficiently as a modulation doped semiconductor laser. The modulation doped semiconductor laser according to an implementation operates as a 1.3 μm band direct modulation semiconductor laser and is an element excellent in high-speed response. This structure may be applied to a semiconductor laser that continuously oscillates or a 1.55 μm band semiconductor laser.

[Manufacturing Method]

Next, a method for manufacturing the modulation doped semiconductor laser according to an implementation will be described. An n-type semiconductor layer 12 is formed of InGaAlAs on the lower cladding layer 10 shown in FIG. 2. On top of this, for example, five layers of multiple quantum wells 14 are formed in which the first layer 16 (barrier layer) and the second layer 18 (quantum well layer) are each composed of InGaAlAs. A p-type semiconductor layer 20 and the diffraction grating 28 made of InGaAlAs are formed thereon.

The p-type semiconductor layer 20 and the diffraction grating 28 are formed by using a metal organic chemical vapor deposition (MOCVD) method. In forming the n-type semiconductor layer 12, multiple layers are grown while doping $1 \times 10^{18}$ cm$^{-3}$ of Si as an impurity. Similarly, in forming the first layer 16 (barrier layer) of the multiple quantum well 14, multiple layers are grown while doping $2 \times 10^{17}$ cm$^{-3}$ of Zn, and in forming the second layer 18 (quantum well layer), multiple layers are grown while doping both $2 \times 10^{17}$ cm$^{-3}$ of Zn and $2 \times 10^{17}$ cm$^{-3}$ of Si. The multiple quantum well 14 is composed of a composition corresponding to a wavelength of 1.3 μm band. In the formation of the p-type semiconductor layer 20 and the diffraction grating 28, $1 \times 10^{18}$ cm$^{-3}$ of Zn is doped.

Next, the diffraction grating 28 is processed into a shape as a diffraction grating, and the upper cladding layer 22 and a contact layer (not shown) doped with $1 \times 10^{18}$ cm$^{-3}$ of Zn are grown in multiple layers. Further, the upper clad layer 22 is processed into a ridge shape, a passivation film (not shown) is formed, the electrode 26 is formed on the upper surface, and the electrode 24 is formed on the rear surface. Finally, the modulation doped semiconductor laser is completed by dividing into a plurality of chips and coating the end surfaces. Other contents include self-evident contents from the details of the modulation doped semiconductor laser described above.

Figure 4A:
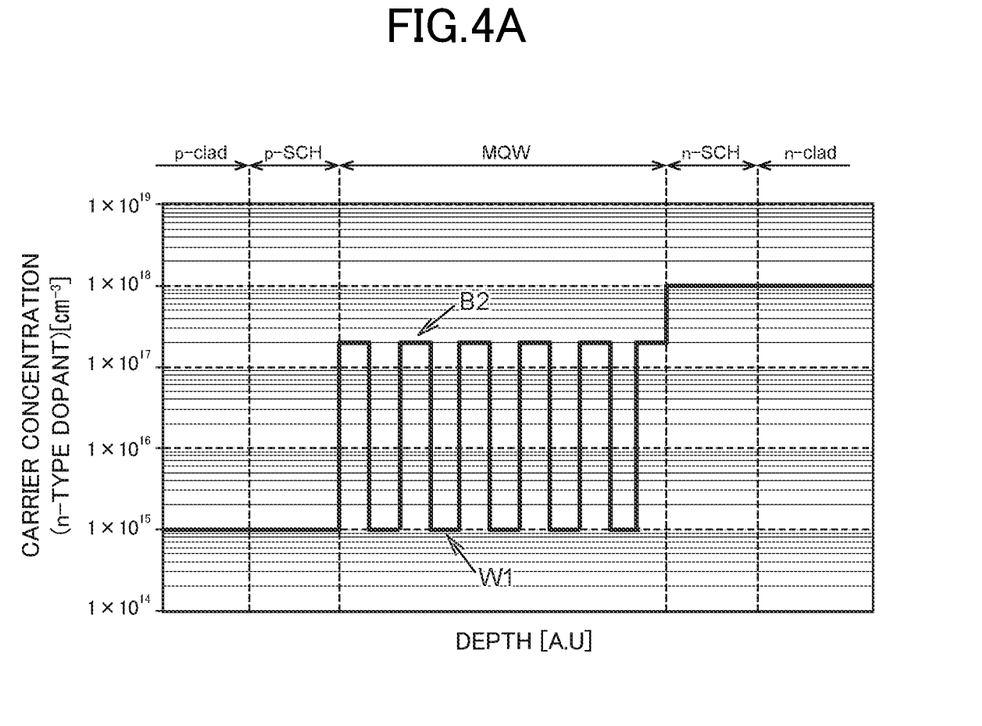
FIG. 4A is a view showing a carrier concentration of a donor (n-type dopant) in a second example.
Figure 4B:
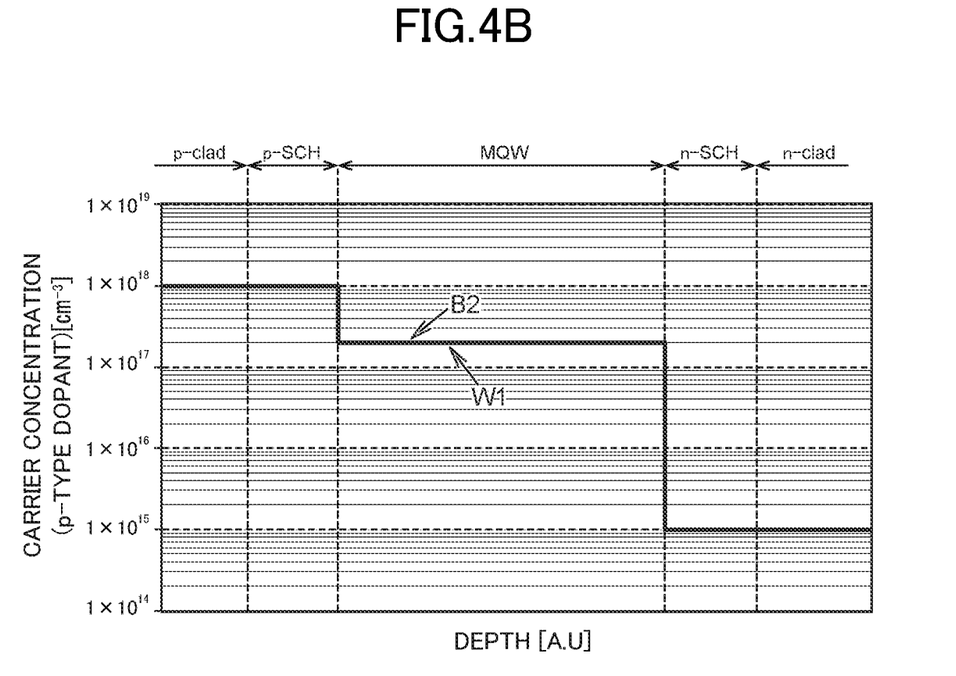
FIG. 4B is a view showing a carrier concentration of an acceptor (p-type dopant) in the second example.
Figure 4C:
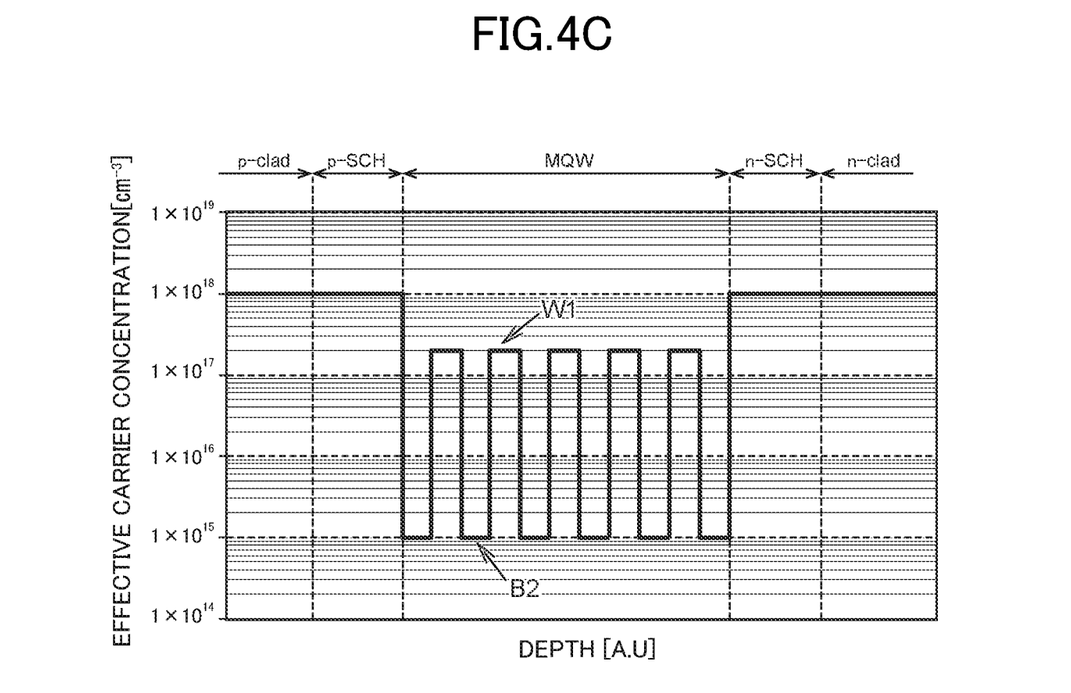
FIG. 4C is a view showing a difference (effective carrier concentration) between the p-type carrier concentration and the n-type carrier concentration in the second example.

FIGS. 4A to 4C are views showing carrier concentrations in the vicinity of a multiple quantum well (MQW) in an implementation. In the implementation, a quantum well layer (W1) is the first layer and a barrier layer (B2) is the second layer. The uppermost barrier layer (B2) of the multiple quantum well (MQW) is the second layer, and the lowermost barrier layer (B2) is also the second layer.

FIG. 4A is a view showing the carrier concentration of a donor (n-type dopant). The n-type semiconductor layer (n-SCH) is doped with $1 \times 10^{18}$ cm$^{-3}$ of Si as an impurity. Si ($2 \times 10^{17}$ cm$^{-3}$) as a donor is added to the barrier layer (B2) of the multiple quantum well (MQW). The barrier layer (B2) is lower than the n-type semiconductor layer in the n-type carrier concentration. In contrast, Si as a donor is not added to the upper cladding layer 22 (p-clad) and the p-type semiconductor layer (p-SCH). Si is not added to the quantum well layer (W1).

FIG. 4B is a view showing a carrier concentration of an acceptor (p-type dopant). In the multiple quantum well (MQW), $2 \times 10^{17}$ cm$^{-3}$ of Zn is doped in both the barrier layer (B2) and the quantum well layer (W1). Since other details are the same as the contents shown in FIG. 3B, description thereof is omitted.

FIG. 4C is a view showing a difference (effective carrier concentration) between the p-type carrier concentration and the n-type carrier concentration. In the barrier layer (B2) of the multiple quantum well (MQW), since both Zn and Si are doped at approximately the same concentration, the two carriers cancel each other, and the effective carrier concentration (difference between the p-type carrier concentration and the n-type carrier concentration) becomes very low. In the barrier layer (B2), the effective carrier concentration is 10% or less of the p-type carrier concentration in the barrier layer (B2). On the other hand, in the quantum well layer (W1), only Zn is doped and p-type carriers remain. That is, a modulation doped semiconductor laser is configured.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A modulation doped semiconductor laser comprising:
a multiple quantum well composed of a plurality of layers including a plurality of first layers and a plurality of second layers stacked alternately and including an acceptor and a donor;
a p-type semiconductor layer in contact with an uppermost layer of the plurality of layers; and
an n-type semiconductor layer in contact with a lowermost layer of the plurality of layers,
the plurality of first layers including the acceptor so that a p-type carrier concentration is 10% or more and 150% or less of the p-type semiconductor layer,
the plurality of second layers containing the acceptor so that the p-type carrier concentration is 10% or more and 150% or less of the p-type semiconductor layer,
the plurality of second layers containing the donor, and
an effective carrier concentration corresponding to a difference between the p-type carrier concentration and an n-type carrier concentration is 10% or less of the p-type carrier concentration of the plurality of second layers.

2. The modulation doped semiconductor laser of claim 1, wherein the p-type semiconductor layer and the n-type semiconductor layer are form a separate confinement hetero structure.

3. The modulation doped semiconductor laser of claim 1, wherein, the p-type carrier concentration is $1 \times 10^{17}$ cm$^{-3}$ or more in each of the plurality of first layers and the plurality of second layers.

4. The modulation doped semiconductor laser of claim 1, wherein each of the uppermost layer and the lowermost layer of the plurality of layers is a corresponding one of the plurality of first layers.

5. The modulation doped semiconductor laser of claim 1, wherein each of the uppermost layer and the lowermost layer of the plurality of layers is a corresponding one of the plurality of second layers.

6. The modulation doped semiconductor laser of claim 1, wherein each of the plurality of first layers is a barrier layer and each of the plurality of second layers is a quantum well layer.

7. The modulation doped semiconductor laser of claim 1, wherein each of the plurality of first layers is a quantum well layer and each of the plurality of second layers is a barrier layer.

8. The modulation doped semiconductor laser of claim 1, wherein the acceptor is at least one of Zn or Mg and the donor is Si.

9. The modulation doped semiconductor laser of claim 1, wherein the plurality of second layers are lower than the p-type semiconductor layer in the p-type carrier concentration.

10. The modulation doped semiconductor laser of claim 1, wherein the plurality of second layers are lower than the n-type semiconductor layer in the n-type carrier concentration.

11. A manufacturing method of a modulation doped semiconductor laser comprising:
forming an n-type semiconductor layer;
forming a multiple quantum well composed of a plurality of layers including a plurality of first layers and a plurality of second layers stacked alternately and containing an acceptor and a donor so that a lowermost layer of the plurality of layers is placed in contact with the n-type semiconductor; and
forming a p-type semiconductor layer by a metal organic chemical vapor deposition method so as to be placed in contact with an uppermost layer of the plurality of layers,
the plurality of first layers including the acceptor so that a p-type carrier concentration is 10% or more and 150% or less of the p-type semiconductor layer,
the plurality of second layers containing the acceptor so that the p-type carrier concentration is 10% or more and 150% or less of the p-type semiconductor layer,
the plurality of second layers containing the donor, and
an effective carrier concentration corresponding to a difference between the p-type carrier concentration and an n-type carrier concentration is 10% or less of the p-type carrier concentration of the plurality of second layers.

12. The manufacturing method of claim 11, wherein the multiple quantum well is formed by the metal organic chemical vapor deposition method.

13. The manufacturing method of claim 11, wherein, the p-type carrier concentration is 1×1017 cm-3 or more in each of the plurality of first layers and the plurality of second layers.

14. The manufacturing method of claim 11, wherein each of the uppermost layer and the lowermost layer of the plurality of layers is a corresponding one of the plurality of first layers.

15. The manufacturing method of claim 11, wherein each of the uppermost layer and the lowermost layer of the plurality of layers is a corresponding one of the plurality of second layers.

16. The manufacturing method of claim 11, wherein each of the plurality of first layers is a barrier layer and each of the plurality of second layers is a quantum well layer.

17. The manufacturing method of claim 11, wherein each of the plurality of first layers is a quantum well layer and each of the plurality of second layers is a barrier layer.

18. The manufacturing method of claim 11, wherein the acceptor is at least one of Zn or Mg and the donor is Si.

19. The manufacturing method of claim 11, wherein the plurality of second layers are lower than the p-type semiconductor layer in the p-type carrier concentration.

20. The manufacturing method of claim 11, wherein the plurality of second layers are lower than the n-type semiconductor layer in the n-type carrier concentration.

* * * * *